United States Patent
Cho et al.

(10) Patent No.: US 7,633,100 B2
(45) Date of Patent: Dec. 15, 2009

(54) PHASE CHANGE RANDOM ACCESS MEMORY DEVICE

(75) Inventors: Woo-yeong Cho, Suwon-si (KR); Jong-soo Seo, Hwaseong-si (KR); Ik-chul Kim, Suwon-si (KR); Young-kug Moon, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 274 days.

(21) Appl. No.: 11/317,292

(22) Filed: Dec. 27, 2005

(65) Prior Publication Data
US 2007/0034908 A1   Feb. 15, 2007

(30) Foreign Application Priority Data
Aug. 10, 2005   (KR) .................... 10-2005-0073414

(51) Int. Cl.
*H01L 29/80* (2006.01)
(52) U.S. Cl. ...................... 257/256; 257/260
(58) Field of Classification Search ............... 257/2–5, 257/256, 260, E29.002; 438/167, 800, 102–103; 365/163
See application file for complete search history.

(56) References Cited

U.S. PATENT DOCUMENTS

| | | | |
|---|---|---|---|
| 4,404,660 A | | 9/1983 | Menachem |
| 5,751,012 A | * | 5/1998 | Wolstenholme et al. ........ 257/5 |
| 2003/0223292 A1 | | 12/2003 | Nejad et al. |
| 2004/0188714 A1 | * | 9/2004 | Scheuerlein et al. ........ 257/200 |
| 2004/0246808 A1 | | 12/2004 | Cho et al. |
| 2005/0117397 A1 | * | 6/2005 | Morimoto ............... 365/185.21 |

FOREIGN PATENT DOCUMENTS

| | | |
|---|---|---|
| EP | 1326258 A2 | 7/2003 |
| JP | 9213077 | 8/1997 |
| JP | 2001160289 | 6/2001 |

* cited by examiner

*Primary Examiner*—Bradley K Smith
*Assistant Examiner*—Jami M Valentine
(74) *Attorney, Agent, or Firm*—Volentine & Whitt, P.L.L.C.

(57) ABSTRACT

A phase-change random access memory device includes a global bit line connected to a write circuit and a read circuit; a plurality of local bit lines, each of which being connected to a plurality of phase-change memory cells; and a plurality of column select transistors selectively connecting the global bit line with each of the plurality of local bit lines. Each column select transistor has a resistance that depends on distance from the write circuit and the read circuit.

20 Claims, 9 Drawing Sheets

PHASE CHANGE RANDOM ACCESS MEMORY DEVICE

BACKGROUND OF THE INVENTION

1. Field of the Invention

The present invention generally relates to a phase-change random access memory devices.

A claim of priority is made to Korean Patent Application No. 10-2005-0073414, filed Aug. 10, 2005, the entirety of which is incorporated herein by reference.

2. Description of the Related Art

Phase change random access memories (PRAMs) are non-volatile memory devices that store data using a phase change material, e.g., Ge—Sb—Te (GST). The phase change material, which exhibits different resistive values depending on the crystalline or amorphous phase thereof, is programmed by thermal treatment to set the phase of the material.

The phase-change material of the PRAM exhibits a relatively low resistance in its crystalline state, and a relatively high resistance in its amorphous state. In conventional nomenclature, the low-resistance crystalline state is referred to as a 'set' state and is designated logic "0", while the high-resistance amorphous state is referred to as a 'reset' state and is designated logic "1".

The terms "crystalline" and "amorphous" are relative terms in the context of phase-change materials. That is, when a phase-change memory cell is said to be in its crystalline state, one skilled in the art will understand that the phase-change material of the cell has a more well-ordered crystalline structure when compared to its amorphous state. A phase-change memory cell in its crystalline state need not be fully crystalline, and a phase-change memory cell in its amorphous state need not be fully amorphous.

Generally, the phase-change material of a PRAM is reset to an amorphous state by joule heating of the material in excess of its melting point temperature for a relatively short period of time. On the other hand, the phase-change material is set to a crystalline state by heating the material below its melting point temperature for a longer period of time. In each case, the material is allowed to cool to its original temperature after the heat treatment. Generally, however, the cooling occurs much more rapidly when the phase-change material is reset to its amorphous state.

In a read operation, a given read current is provided to a selected memory cell, and the "1" or "0" resistive state of the memory cell is discriminated using a sense amplifier based on a voltage of the cell.

In order to increase the capacity and integration density of phase change memory devices, the phase-change memory devices may be implemented as a hierarchical bit line structure having a global bit line and a plurality of local bit lines. In this case, there is a difference in physical length between phase-change memory cells coupled to local bit lines located far away from a write circuit and/or a read circuit and phase-change memory cells coupled to local bit lines located near the write circuit and/or read circuit. Thus, noting that a parasitic resistance is present in a global bit line, the resistance of a path extending from a write circuit and/or a read circuit to a selected memory cell varies depending on the position of the selected phase-change memory cell.

Thus, due to the resistance variations, a smaller amount of write or read current is applied to a phase-change memory cell coupled to a local bit line located far from a write and/or read circuit than a phase-change memory cell coupled to a local bit line located close to the write and/or read circuit. These variations in read and/or write currents can result in read and/or write failures.

SUMMARY OF THE INVENTION

According to an aspect of the present invention, there is provided a phase-change random access memory device including a global bit line connected to a write circuit and a read circuit; a plurality of local bit lines, each local bit line being connected to a plurality of phase-change memory cells; and a plurality of column select transistors selectively connecting the global bit line with each of the plurality of local bit lines, each column select transistor having a resistance that varies depending on distance from the write circuit and the read circuit.

According to another aspect of the present invention, there is provided a phase-change random access memory device including a plurality of memory blocks, each memory block having multiple phase-change memory cells; a global bit line connected to a write circuit and a read circuit, and extending in one direction such that the global bit line is shared by the plurality of memory blocks; a plurality of local bit lines, each of which extends in the one direction and is connected to a plurality of phase-change memory cells; and a plurality of column select transistors selectively coupling the global bit line with each of the plurality of local bit lines, each column select transistor corresponding to a memory block having a resistance that varies depending on a distance between the write circuit and the read circuit, and the memory block.

According to still another aspect of the present invention, there is provided a phase-change random access memory device including a plurality of memory blocks clustered into at least two groups, each memory block having multiple phase-change memory cells; a global bit line connected to a write circuit and a read circuit, and extending in one direction such that the global bit line is shared by the plurality of memory blocks; a plurality of local bit lines, each of which extends in the one direction and is connected to a plurality of phase-change memory cells; and a plurality of column select transistors selectively coupling the global bit line with each of the plurality of local bit lines, each column select transistor corresponding to a memory group having a resistance that varies depending on a distance between the write circuit and the read circuit, and the memory group.

BRIEF DESCRIPTION OF THE DRAWINGS

The above and other features and advantages of the present invention will become readily apparent from the following description of the preferred embodiments with reference to the accompanying drawings, in which.

DETAILED DESCRIPTION OF THE PREFERRED EMBODIMENTS

Figure 1:
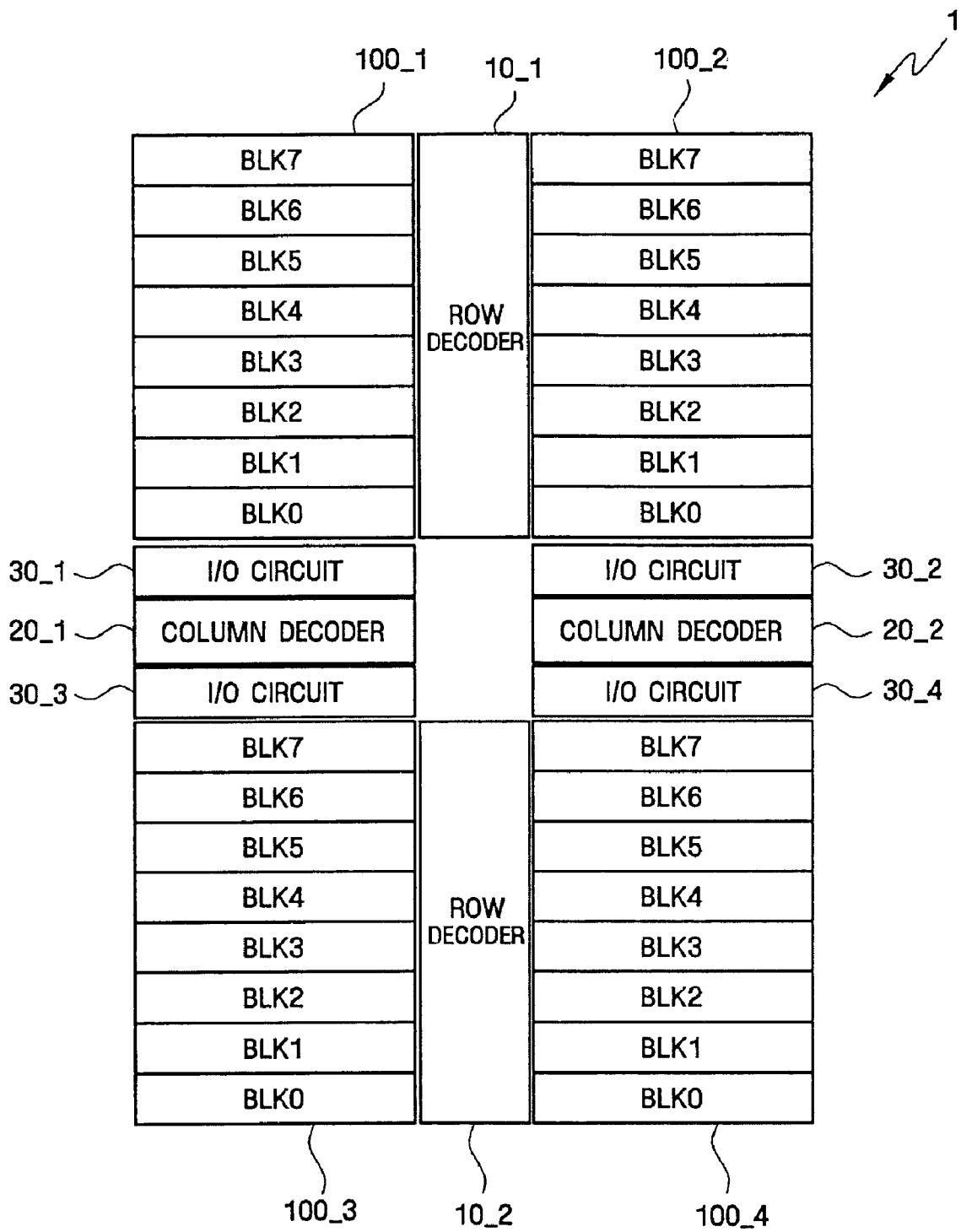
FIGS. 1 and 2 are a block diagram and a circuit diagram of a phase-change random access memory device according to a first embodiment of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art. Like reference numerals refer to like elements throughout the specification.

In the following description, the terms "and/or" comprises each and at least one combination of referenced items.

The present invention will now be described more fully with reference to the accompanying drawings, in which preferred embodiments of the invention are shown.

Figure 2:
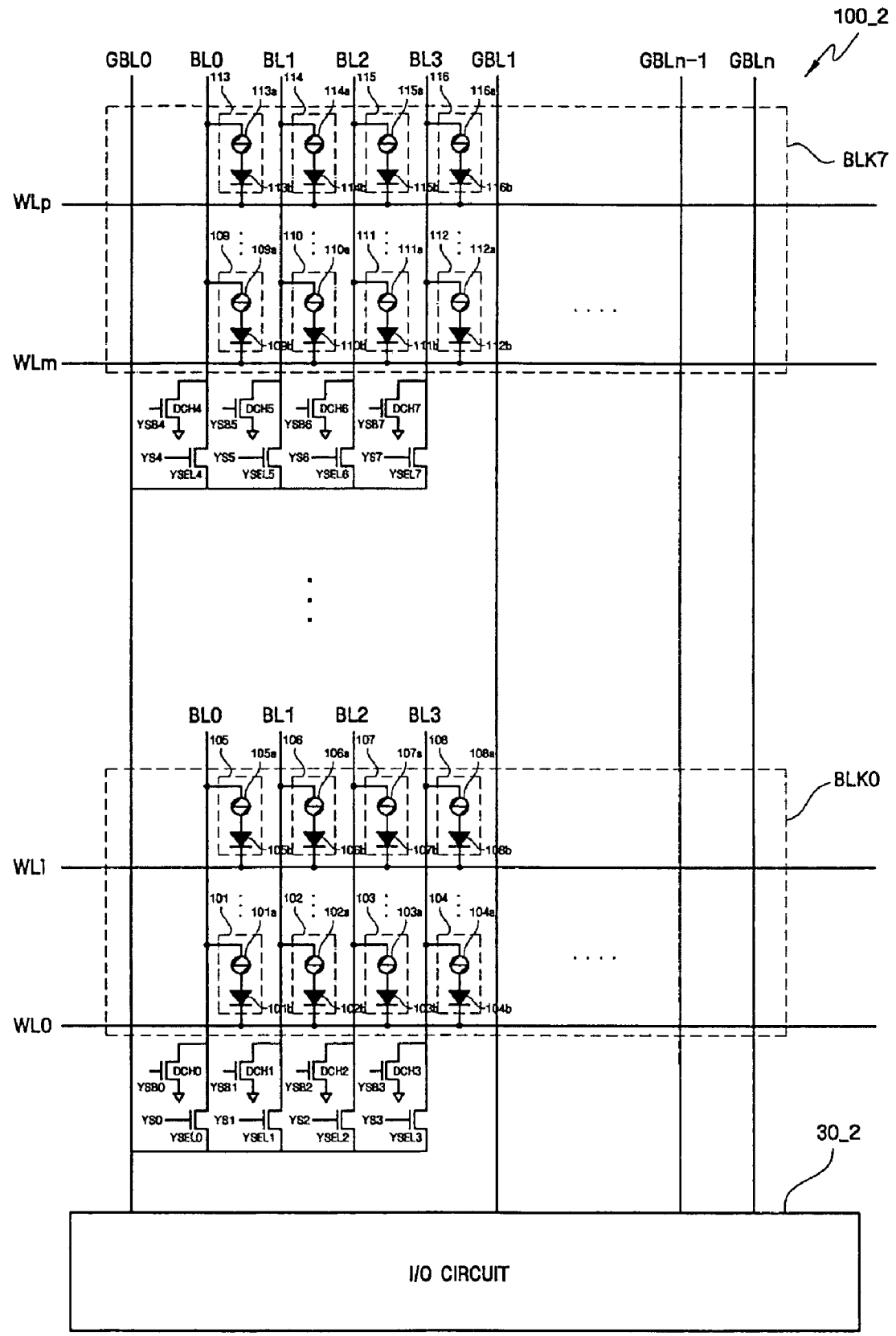

FIGS. 1 and 2 are a block diagram and a circuit diagram of a phase-change random access memory device according to a first embodiment of the present invention. In preferred embodiments of the present invention, a phase-change random access memory device having 4 memory banks is described by way of example, but the invention is not limited thereto.

Referring to FIG. 1, a phase-change random access memory device 1 includes first through fourth memory banks 100_1 through 100_4, row decoders 10_1 and 10_2, column decoders 20_1 and 20_2, and input/output (I/O) circuits 30_1 through 30_4.

Each of the first through fourth memory banks 100_1 through 100_4 include a plurality of phase-change memory cells arranged in a matrix form and a plurality of memory blocks BLKi (i is 0 through 7). Although in the above description each of the memory banks 100_1 through 100_4 includes 8 memory blocks BLKi, it may contain a different number of memory blocks.

The row decoders 10_1 and 10_2 are respectively arranged corresponding to two memory banks 100_1 and 100_2, and 100_3 and 100_4, to designate row addresses in the first through fourth memory banks 100_1 through 100_4. For example, the row decoder 10_1 may select row addresses in the first and second memory banks 100_1 and 100_2.

The column decoders 20_1 and 20_2 are respectively arranged corresponding to two memory banks 100_1 and 100_3, and 100_2 and 100_4, to designate column addresses in the first through fourth memory banks 100_1 through 100_4. For example, the column decoder 20_1 can select column addresses in the first and third memory banks 100_1 and 100_3.

The I/O circuits 30_1 through 30_4 are arranged corresponding to the respective memory banks 100_1 through 100_4 and write and/or read data to and/or from the appropriate memory banks 30_1 through 30_4. Although not shown in FIG. 1, each of the I/O circuits 30_1 through 30_4 may include a write circuit and/or a read circuit. The configuration of the I/O circuit 30_1 through 30_4 will be described in detail later with reference to FIGS. 3 and 5.

Referring to FIG. 2, the memory bank 100_2 includes a plurality of memory blocks BLKi (i is 0 through 7), a plurality of global bit lines GBLj (j is 0 through n) and a plurality of local bit lines BL0 through BL3, column select transistors YSELk (k is 0 through 7), and discharge transistors DCHk (k is 0 through 7).

The plurality of memory blocks BLKi include a plurality of phase-change memory cells 101 through 116 disposed at positions where a plurality of word lines WL0, WLI, WLm, and WLp and a plurality of bit lines intersect. In particular, the bit lines are arranged to form a hierarchical structure containing the plurality of global bit lines GBLj and the plurality of local bit lines BL0 through BL3. In more detail, the plurality of global bit lines GBLj are connected to the I/O circuit 30_2 and extend in one direction to be shared by the plurality of memory blocks BLKi. The plurality of local bit lines BL0 through BL3 are selectively connected to each of the global bit lines GBLj through the column select transistors YSELk while being coupled to the plurality of phase-change memory cells 101 through 116.

For example, when 8M memory bank 100_2 includes eight 1 M memory blocks BLKi, a number 8K of word lines extend perpendicular to one direction while 256 global bit lines GBLj extend in the one direction so that they are shared by the plurality of memory blocks BLKi. Four local bit lines BL0 through BL3 are connected to each of the 256 global bit lines GBLj for each memory block BLKi. 1K phase-change memory cells are coupled to each of the four local bit lines BL0 through BL3.

The plurality of memory cells 101 through 116 respectively include variable resistors 101a through 116a including phase-change materials having different first and second resistances depending on its state (amorphous or crystalline) and control elements 101b through 116b controlling current flowing through the variable resistors 101a through 116a. Each of the variable resistors 101a through 116a is connected between each of the local bit lines BL0 through BL3 and corresponding one of the control elements 101b through 116b. Each of the control elements 101b through 116b is a diode having an anode coupled to a corresponding one of the variable resistors 101a through 116a and a cathode coupled to one of the word lines WL0, WLI, WLm, and WLp. Unlike in FIG. 2, the positions of the variable resistors 101a through 116a and the control elements 101b through 116b may be changed depending on the type of application. The phase-change material may be a binary (two-element) compound such as GaSb, InSb, InSe, $Sb_2Te_3$, or GeTe, a ternary (three-element) compound such as GeSbTe, GaSeTe, InSbTe, $SnSb_2Te_4$, or InSbGe, or a quaternary (four-element) compound such as AgInSbTe, (GeSn)SbTe, GeSb(SeTe), or $Te_{81}Ge_{15}Sb_2S_2$. The most commonly used phase-change material is GeSbTe.

The column select transistors YSELk (k is 0 through 7) selectively connect each of the global bit lines GBLj with the local bit lines BL0 through BL3 in response to column select signals YSi (i is 0 through 7). The column select signal YSi is turned on by a decoded signal of a corresponding column address and block information.

In particular, the resistance of each of the column select transistors YSELk (k is 0 through 7) varies depending on its distance from the I/O circuit 30_2. The resistance of column select transistors YSELk (k=4~7) located far from the I/O circuit 30_2 is less than that of column select transistors YSELk (k=0~3) located close to the I/O circuit 30_2. For example, the resistance of the plurality of column select transistors YSELk (k=0~3) corresponding to the first memory block BLK0 is greater than that of the plurality of column select transistors YSELk (k=4~7) corresponding to the eighth memory block BLK7. By adjusting the amount of resistance in this way, the amount of write current and read current passing through the column select transistors YSELk (k=4~7) located far from the I/O circuit 30_2 can be made substantially equal to the amount of write current and read current flowing through the column select transistors YSELk (k=0~3) located close to the I/O circuit 30_2. This will later be described in detail with reference to FIGS. 3 through 6.

Various methods may be used to decrease the resistance of the column select transistors YSELk (k=4~7) located far from the I/O circuit 30_2. For example, the column select transistors YSELk (k=4~7) located far from the I/O circuit 30_2 may be made larger than those located close thereto. This is achieved by increasing the W/L ratio (width (W) to length (L)) of channel regions of the column select transistors YSELk (k=4~7), which is possible by increasing the width of the channel regions or reducing the length thereof. However, because the channel region formed by a photo process mostly has a minimum length, increasing the W/L can mainly be achieved by increasing the width of the channel region. Another approach to decreasing the resistance of the column select transistors YSELk (k=0~7) is to reduce a threshold voltage by increasing the concentration of impurities doped into a channel region thereof. For example, the concentration of impurities doped into channel regions of the column select transistors YSELk (k=4~7) located far from the I/O circuit 30_2 is made higher than that of impurities doped into channel regions of the column select transistors YSELk (k=0~3) located close thereto.

Each of the discharge transistors DCHi (i=0~7) are disposed between each of the plurality of local bit lines BL0 through BL3 and a ground voltage, and each discharges a voltage applied to the appropriate local bit line in response to a corresponding one of complementary column select signals YSBi (i=0~7) both before and after write or read operation. Thus, the discharge transistors DCHi (i=0~7) are turned on when the column select transistors YSELk (k=0~7) are turned off.

Figure 3:
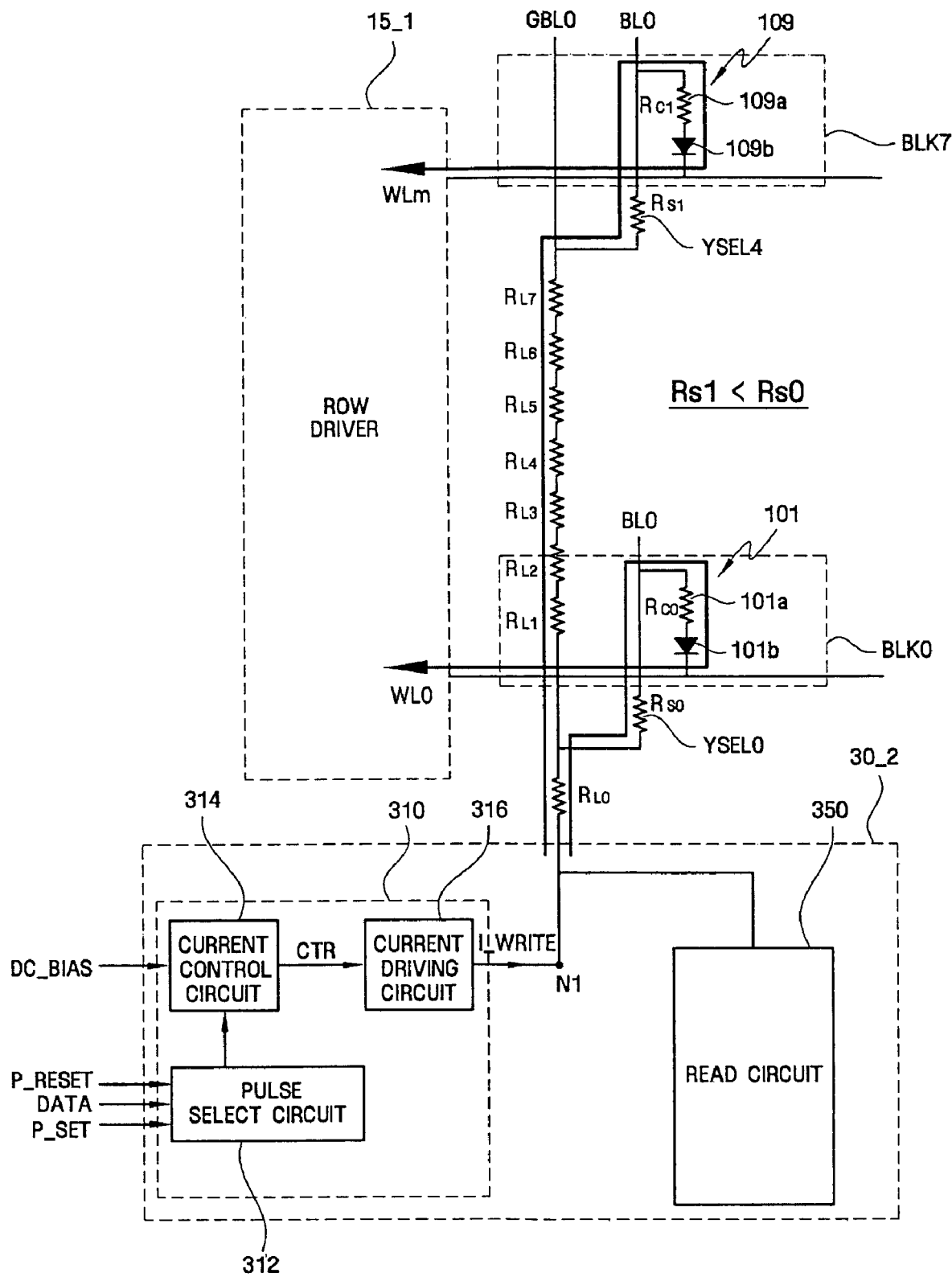
FIG. 3 is a circuit diagram for explaining a write operation of a phase-change random access memory device according to an embodiment of the present invention.
Figure 4:
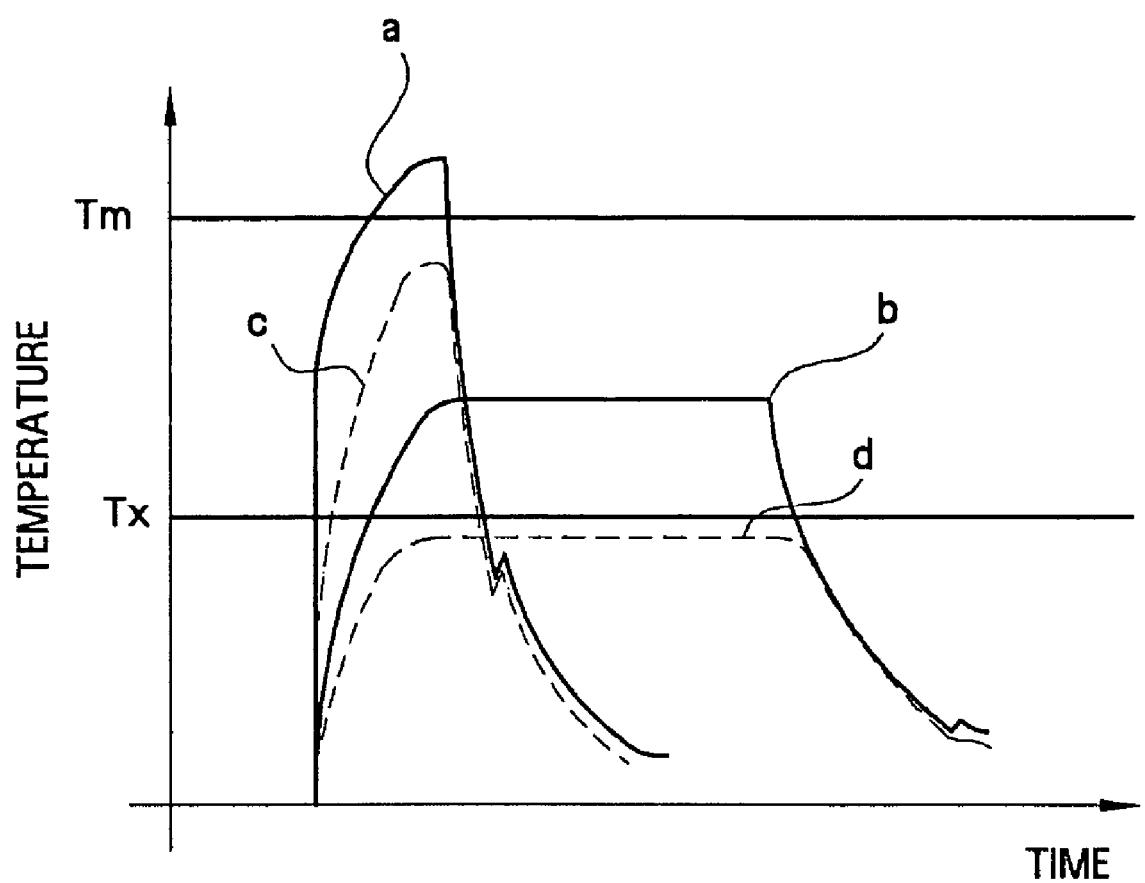
FIG. 4 is a diagram for explaining a condition for inducing a phase transition of a phase-change material of a phase-change memory cell.

FIG. 3 is a circuit diagram for explaining a write operation of a phase-change random access memory device according to an embodiment of the present invention, and FIG. 4 is a diagram for explaining a condition for inducing a phase transition of a phase-change material of a phase-change memory cell. For convenience of explanation, FIG. 3 shows only phase-change memory cells 101 and 109 in the first and eighth memory blocks BLK0 and BLK7 among the phase-change memory cells in the first through eighth memory blocks BLK0 through BLK7. The parasitic resistance of a global bit line GBL0 is indicated on a global bit line GBL0 and column select transistor YSEL0 and YSEL4 and variable resistors 109a and 109b are indicated by predetermined resistances.

Referring to FIGS. 3 and 4, a word line WL0 or WLm is selected by a row driver 15_1 and a local bit line BL0 is selected by a column decoder (not shown) to select a phase-change memory cell 101 or 109 to be written to. In particular, when a diode is used as the control element 101b or 109b, the selected word line WL0 or WLm is driven low, causing the diode to turn on.

Data are written to the phase memory cells 101 and 109 using Joule heat generated by providing write current I_WRITE to the variable resistors 101a and 109a containing phase-change materials. More specifically, a phase-change material is heated above its melting temperature Tm by a current flowing through the phase-change material and then rapidly cooled, so that it goes into the amorphous state, i.e., logic level "1" (See curve a in FIG. 4). The phase-change material is then heated to a temperature between crystallization temperature Tx and melting temperature Tm for a predetermined period of time and cooled, so that the phase-change material goes into the crystalline state, i.e., logical level "0" (See curve b in FIG. 4). Thus, it is important to provide a considerably precise amount of write current I_WRITE for a predetermined period of time in order to induce a phase transition of the phase-change material. For example, write current I_WRITE of about 1 mA and of about 0.6 to 0.7 mA may be provided for reset operation and set operation, respectively.

The write current I_WRITE may be provided through a write circuit 310. In the following description, the write circuit 310 is more fully described in, for example, U.S. Patent Application No. 2004/0246808, the disclosure of which is hereby incorporated herein by reference as if fully set forth herein.

Referring to FIG. 3, the write circuit 310 includes a pulse select circuit 312, a current control circuit 314, and a current driving circuit 316. The pulse select circuit 312 selectively sends reset pulse P_RESET or set pulse P_SET for writing logical level 1 or 0 to a selected phase-change memory cell 101 or 109 to the current control circuit 314. More specifically, the pulse select circuit 312 delivers a reset pulse P_RESET or set pulse P_SET input according to the logic level of data DATA, and then delivers data DATA whose transmission was delayed to the current control circuit 314. Here, the reset pulse P_RESET or set pulse P_SET is a current pulse and the reset pulse P_RESET has an enable interval shorter than the set pulse P_SET.

The current control circuit 314 controls the amount of current to be supplied to the current driving circuit 316 during an enable interval of the reset pulse P_RESET or set pulse P_SET. More specifically, a bias voltage DC_BIAS having a predetermined voltage level is applied to the current control circuit 314 to ensure stable operation of the current control circuit 314. When the logic level of data DATA provided by the pulse select circuit 312 is at a first level, a control signal CTR having a second level is output during an enable interval of the reset pulse P_RESET. On the other hand, when the logic level of data DATA is at a second level, a control signal CTR having a first level is output during an enable interval of the set pulse P_SET. The current driving circuit 316 outputs write current I_WRITE to a selected phase-change memory cell through an output node N1 in response to the control signal CTR during the enable interval of the reset pulse P_RESET or set pulse P_SET. The current driving circuit 316 also discharges the output node N1 during a disable interval of reset pulse P_RESET or set pulse P_SET.

However, even if the write circuit 310 provides a predetermined amount of write current I_WRITE through this process, wrong data DATA may be stored as the distance between a selected phase-change memory cell 101 or 109 and the write circuit 310 increases, because there is a difference in physical length between the phase-change memory cell 101 within the first memory block BLK0 located close to the write circuit 310 and the phase change memory cell 109 within the eighth memory block BLK7 located far therefrom.

More specifically, because parasitic resistance is present in the global bit line GBL0, the resistance of a path extending from the write circuit 310 to the selected memory cell 101 or 109 varies depending on the position of the selected phase-change memory cell 101 or 109. That is, the phase-change memory cells 101 and 109 have a resistance difference corresponding to the difference in physical distance from the write circuit 310. The resistance of a path between the write circuit 310 and the phase-change memory cell 101 within the first memory block BLK0 is $R_{L0}+R_{S0}+R_{C0}$, while the resistance of a path between the write circuit 310 and the phase-change memory cell 109 within the eighth memory block BLK7 is $$\left(\sum_{i=0}^{7} R_{Li}\right) + R_{S1} + R_{C1}.$$

$R_{L0}$ through $R_{L7}$ are the resistances of the global bit line GBL0, $R_{S0}$ and $R_{S1}$ are the resistances of the column select transistors YSEL0 and YSEL4, and $R_{C0}$ and $R_{C1}$ are the resistances of phase change materials of the variable resistors 101a and 109a.

Thus, the amount of write current $I\_WRITE_0$ reaching the phase-change memory cell 101 within the first memory block BLK0 is different from that of write current $I\_WRITE_1$ reaching the phase-change memory cell 109 within the eighth memory block BLK7. The level of write current $I\_WRITE_1$ provided to the memory cell 109 far away from the write circuit 310 is lower than the level of write current $I\_WRITE_0$ provided to the memory cell 101 close thereto.

As described above, data are written to the phase-change memory cell 101 or 109 using Joule heat generated by providing write current $I\_WRITE_0$ or $I\_WRITE_1$ to the variable resistors 101a or 109a. The Joule heat is proportional to the square of the write current $I\_WRITE_0$ or $I\_WRITE_1$. Thus, when the level of the write current $I\_WRITE_1$ provided to the phase-change memory cell 109 away from the write circuit 310 is low, Joule heat enough to write data to the phase-change memory cell 109 is not generated. Furthermore, because the temperature of the phase-change memory cell 101 or 109 is proportional to the quantity of Joule heat, the temperature of the phase-change memory cell 109 away from the write circuit 310 varies with time as shown in curves c and d of FIG. 4. As evident from FIG. 4, the phase-change material is not heated to a temperature required to induce a phase transition, which may cause the phase-change memory cell 109 away from the write circuit 310 to malfunction. That is, a logic level corresponding to input data DATA may not be stored in the phase-change memory cell 109. In particular, when the phase-change memory cell 109 is in a reset state, it is more difficult to write data than when it is in a set state because the resistance $R_{C1}$ is high.

Thus, the present invention makes the resistance $R_{S1}$ of the column select transistor YSEL4 away from the write circuit 310 lower than the resistance $R_{S0}$ of the column select transistor YSEL0 close thereto. As described earlier, reducing the resistance may be achieved by increasing the size of the column select transistor YSEL4 or the concentration of impurities doped into a channel region for adjusting a threshold voltage.

In such a manner, the resistance of a path between the write circuit 310 and either the phase-change memory cell 101 or 109 within a different memory block BLK0 or BLK7 can be made substantially equal to each other, regardless of which of the phase-change memory cells 101 and 109 is selected. Thus, because the same amount of write current $I\_WRITE$ is applied to the phase-change memory cells 101 and 109 within the memory blocks BLK0 and BLK7, it is possible to reduce the risk of failure during a write operation.

Figure 5:
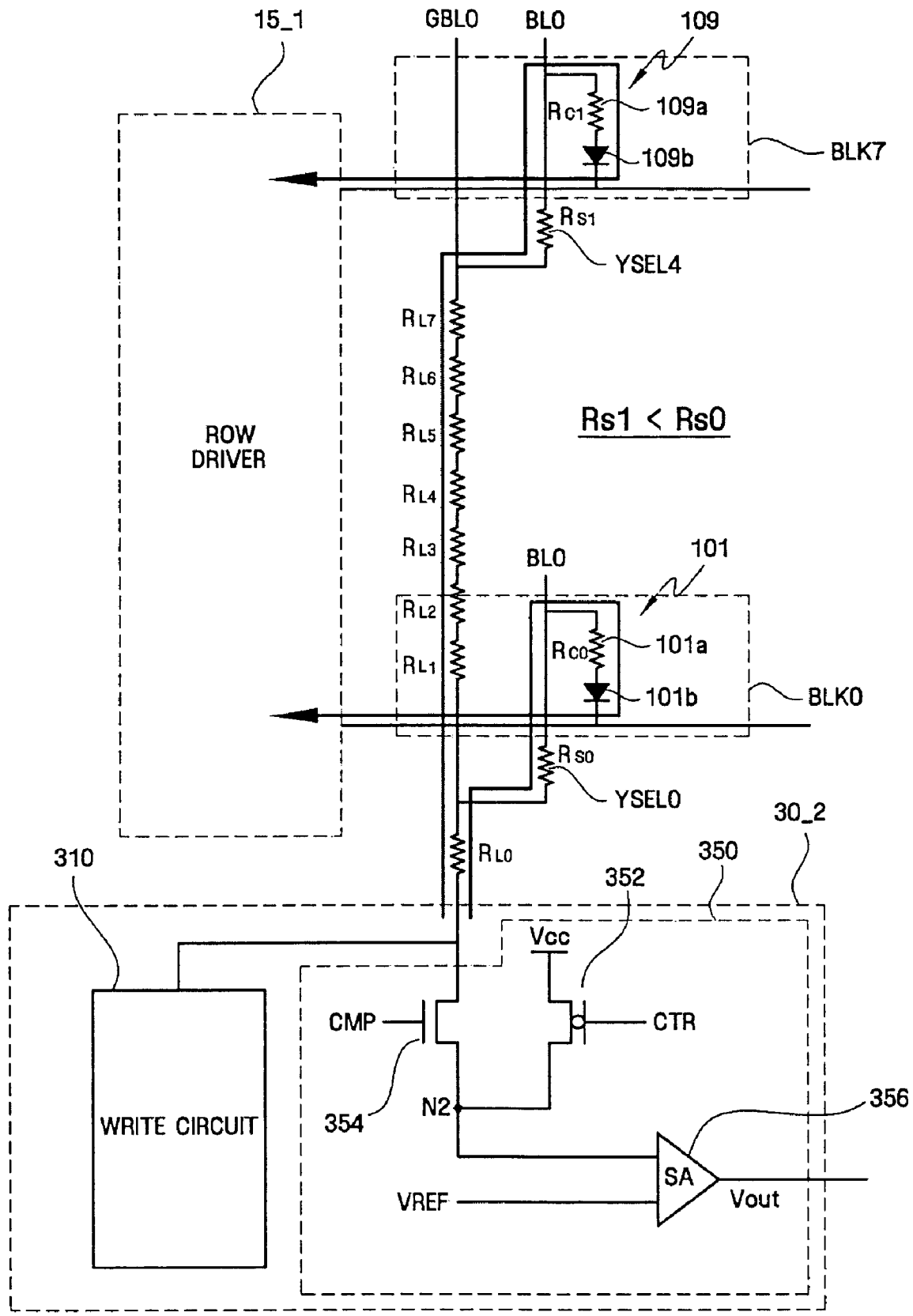
FIG. 5 is a circuit diagram for explaining a read operation of a phase-change random access memory device according to an embodiment of the present invention.
Figure 6:
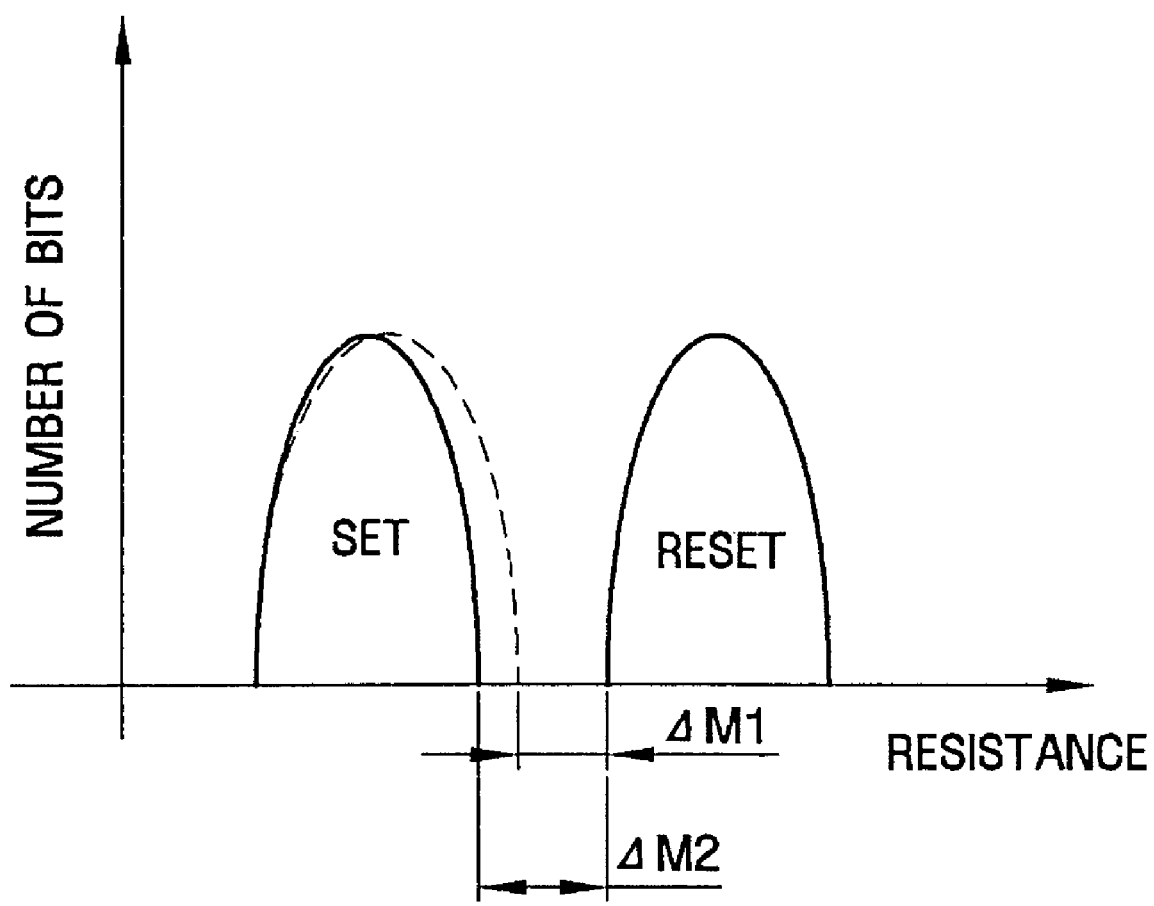
FIG. 6 is a graph illustrating distributions of set resistances and reset resistances of a phase-change memory cell.

FIG. 5 is a circuit diagram for explaining a read operation of a phase-change random access memory device according to an embodiment of the present invention, and FIG. 6 is a graph illustrating distributions of set resistances and reset resistances of a phase-change memory cell.

An operation of reading data from a phase-change memory cell will now be described with reference to FIGS. 5 and 6.

Before the read operation begins, a precharge transistor 352 is turned on to precharge a sensing node N2 to a supply voltage level.

Then, a word line WL0 or WLm is selected by a row driver 15_1 and a local bit line BL0 is selected by a column decoder (not shown) to select a phase-change memory cell 101 or 109 to be written to. When the read operation begins by issuing a read command, the precharge transistor 352 is turned off and ceases to precharge the sensing node N2. Also, a read current I_READ is supplied to the sensing node N2 by a read current supply circuit (not shown).

At the same time, clamp control signal CMP of a predetermined voltage level is applied to a gate of a clamp transistor 354 and clamps the global bit line GBL0 to a predetermined voltage level below threshold voltage Vth. This is because a phase transition of the phase-change material in the variable resistor 101a or 109a occurs when a voltage exceeding the threshold voltage Vth is applied.

Thus, read current I_READ is provided to a selected phase-change memory cell by a clamped voltage level and a shoot-through current is generated according to the resistance of the phase-change material.

Upon generating the shoot-through current, the voltage level of the sensing node N2 is also changed. Then, a sense amplifier SA 356 compares the voltage level of the sensing node N2 with the voltage level of reference voltage VREF, and reads out the logic level of the phase-change memory cell 101 or 109.

Even if a read circuit 350 performs a read operation using the above-mentioned process, a failure may occur during the operation of reading stored data as a distance between the read circuit 350 and the selected phase-change memory cell 101 or 109 increases, because there is a difference in physical length between the phase-change memory cell 101 within the first memory block BLK0 located close to the read circuit 350, and the phase change memory cell 109 within the eighth memory block BLK7 located far therefrom.

As described above, because parasitic resistance is present in the global bit line GBL0, the resistance of a path extending from the read circuit 350 to the selected memory cell 101 or 109 varies depending on the position of the selected phase-change memory cell 101 or 109. That is, the phase-change memory cells 101 and 109 have a resistance difference corresponding to the difference in physical distance from the read circuit 350. The resistance of a path between the read circuit 350 and the phase-change memory cell 101 within the first memory block BLK0 is $R_{L0}+R_{S0}+R_{C0}$, while the resistance of a path between the read circuit 350 and the phase-change memory cell 109 within the eighth memory block BLK7 is $$\left(\sum_{i=0}^{7} R_{Li}\right) + R_{S1} + R_{C1}.$$

$R_{L0}$ through $R_{L7}$ are the resistances of the global bit line GBL0, $R_{S0}$ and $R_{S1}$ are the resistances of the column select transistors YSEL0 and YSEL4, and $R_{C0}$ and $R_{C1}$ are the resistances of phase change materials of the variable resistors 101a and 109a.

In this case, when the phase-change memory cell 109 within the eighth memory block BLK7 is in a set state, it may possibly be misunderstood as being in a reset state. That is, when the phase-change memory cell 109 is in a reset state, it may not be significantly affected by a voltage consumed by $$\sum_{i=0}^{7} R_{Li}$$

because the resistance $R_{C1}$ has a sufficiently high value. However, when the phase-change memory cell 109 is in a set state, it may be easily affected by $$\sum_{i=0}^{7} R_{Li}$$

because the resistance $R_{C1}$ has a low value.

Further, the sense amplifier SA 356 may not distinguish a set state from a reset state because margin ΔM1 between set resistance and reset resistance is very small, as evident from the distributions of set resistance and reset resistance for a path between the read circuit 350 and either of the phase-change memory cells 101 and 109 illustrated in FIG. 6.

Thus, the present invention makes the resistance $R_{S1}$ of the column select transistor YSEL4 far away from the read circuit lower than the resistance $R_{S0}$ of the column select transistor YSEL0 close thereto. As described earlier, reducing the resistance may be achieved by increasing the size of the column select transistor YSEL4 or the concentration of impurities doped into a channel region for adjusting a threshold voltage. By adjusting the amount of resistance in this way, the resistance of a path between the read circuit 310 and either the phase-change memory cell 101 or 109 within a different memory block BLK0 or BLK7 can be made substantially equal to each other, thereby providing a sufficient margin between set resistance and reset resistance of a path between the read circuit 350 and either of the phase-change memory cells 101 and 109 with different memory blocks BLK0 and BLK7, while reducing the risk of failure during read operation. It should be understood that for this embodiment in general, the resistances of the column select transistors at positions progressively further away from the read circuit are made to be progressively lower, respectively.

Figure 7:
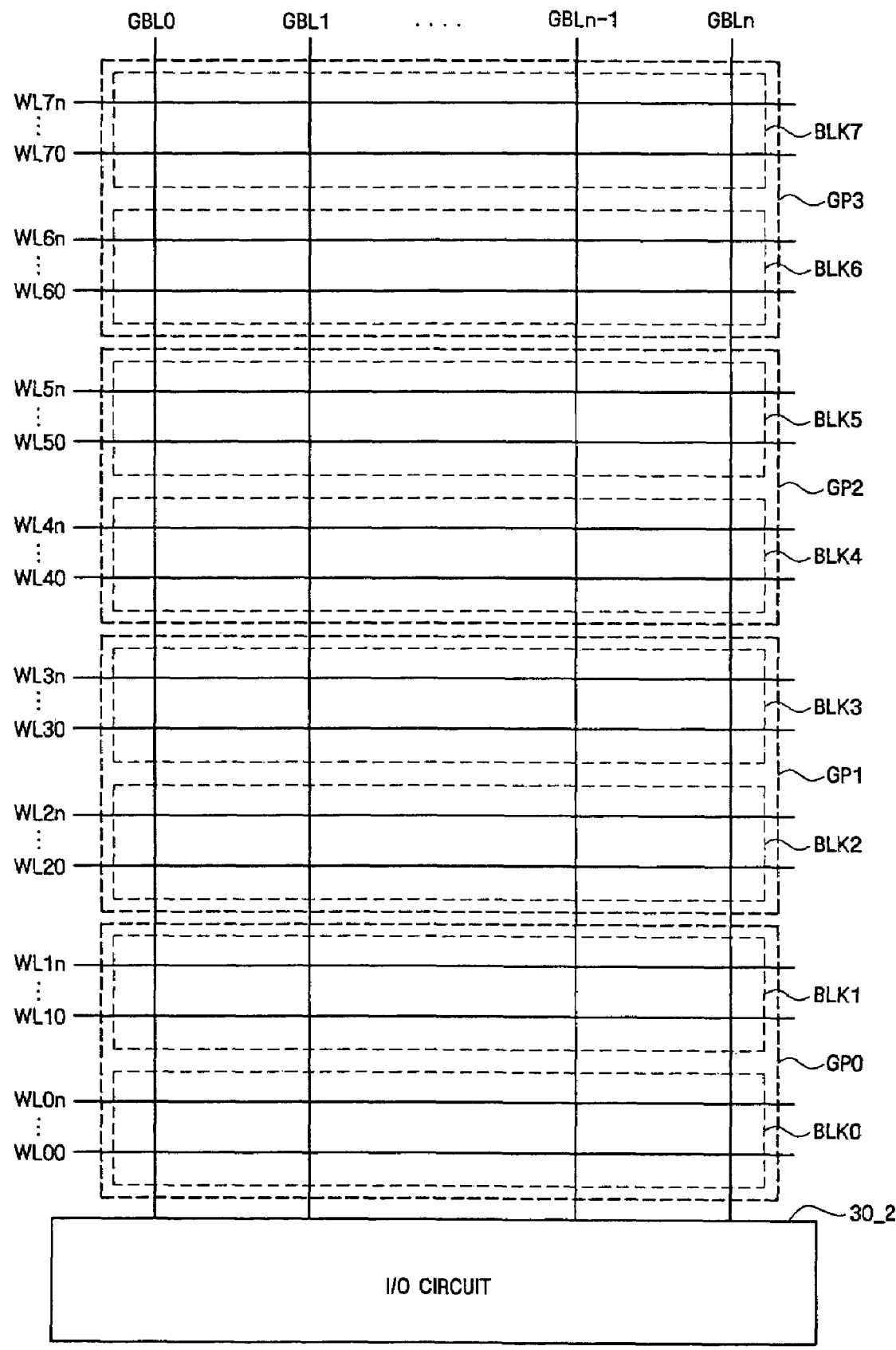
FIG. 7 is a block diagram of a phase-change random access memory device according to a second embodiment of the present invention.

FIG. 7 is a block diagram of a phase-change random access memory device according to a second embodiment of the present invention. Components each having the same function for describing the embodiment shown in FIG. 2 are respectively identified by the same reference numerals, and their repetitive description will be omitted.

Referring to FIG. 7, the feature of the phase-change random access memory device according to the second embodiment of the present invention is that a plurality of memory blocks BLKi (i=0~7) are clustered into two or more memory groups GP0, GP1, GP2, and GP3, and the size of the column select transistors corresponding to the respective memory groups GP0, GP1, GP2, and GP3 varies depending on the distance between an I/O circuit 30_2 and each of the memory groups GP0, GP1, GP2, and GP3. That is, the resistance of column select transistors corresponding to a memory group GP0, GP1, GP2, or GP3 located far from the I/O circuit 30_2 is less than that of column select transistors corresponding to a memory group GP0, GP1, GP2, or GP3 located close thereto. For example, the resistance of the plurality of column select transistors corresponding to the fourth memory group GP3 is less than that of the plurality of column select transistors corresponding to the first memory group GP0.

Although in the above description two memory blocks BLKi each are clustered into single memory groups GP0, GP1, GP2, or GP3, one memory group may include three or more memory blocks (e.g., four).

Figure 8:
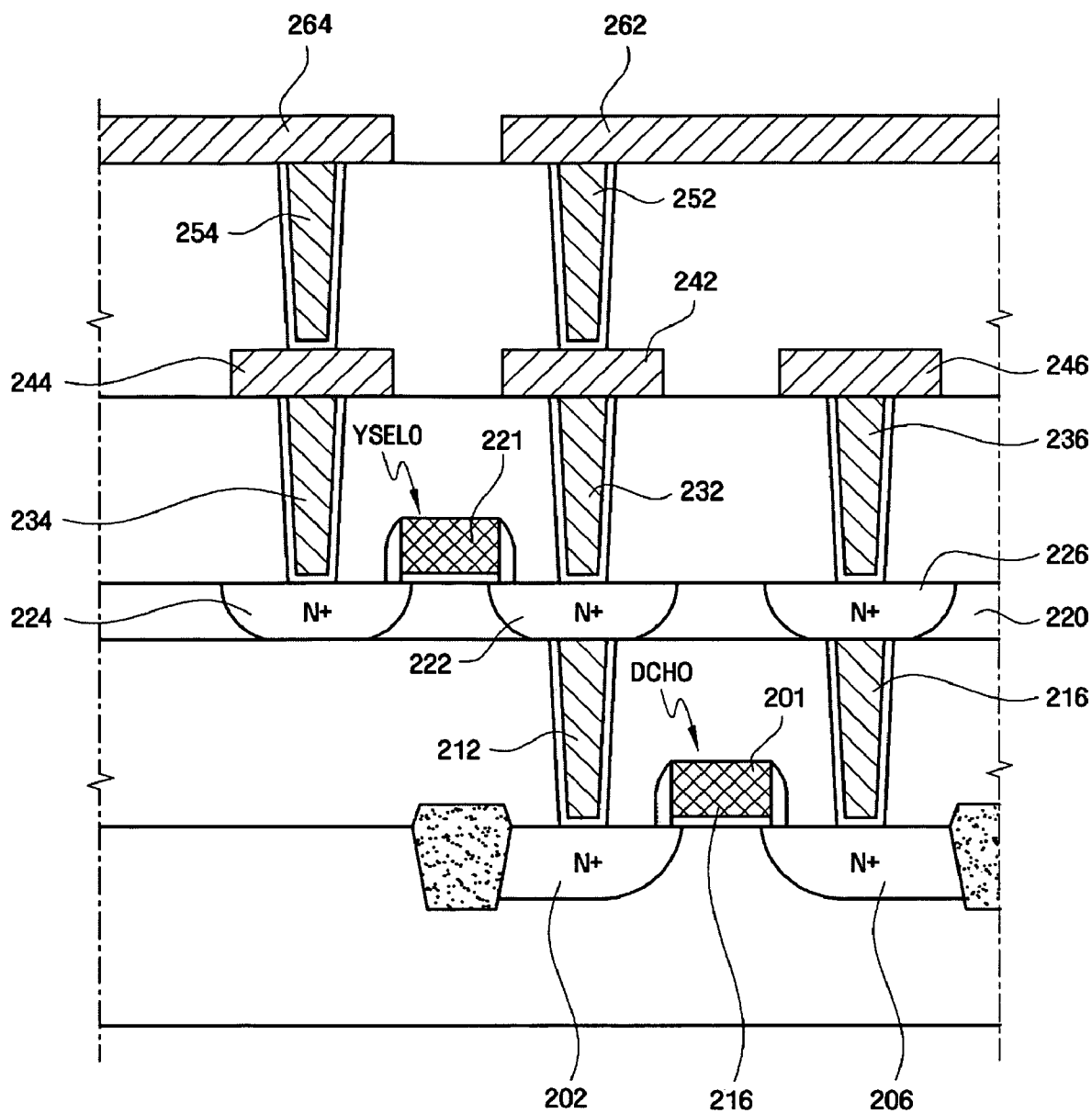
FIG. 8 is a cross-sectional view of a column select transistor and a discharge transistor of a phase-change random access memory device according to a third embodiment of the present invention.

FIG. 8 is a cross-sectional view of a column select transistor and a discharge transistor for a phase-change random access memory device according to a third embodiment of the present invention.

Referring to FIG. 8, a column select transistor YSEL0 is disposed in a different layer than the discharge transistor DCH0. A transistor disposed in the upper layer may be a thin film transistor, while a transistor in the lower layer may be a bulk transistor. The thin film transistor may be formed in a silicon epitaxial layer 220. For convenience of explanation, it is assumed that the discharge transistor DCH0 is disposed in the lower layer and the column select transistor YSEL0 is disposed in the upper layer, although the position of the two transistors DCH0 and YSEL0 may vary according to a design. Although not shown in FIG. 8, a gate 201 of the discharge transistor DCH0 is connected to a complementary column select signal YSB0, while a gate 221 of the column select transistor YSEL0 is connected to a column select signal YS0.

A drain 202 of the discharge transistor DCH0 and a source 222 of the column select transistor YSEL0 are respectively connected to a landing pad 242 through contact plugs 212 and 232. The landing pad 242 is connected to a local bit line 262 through a via plug 252. Although not shown in FIG. 8, the local bit line 262 is coupled to a phase-change material of a phase-change memory cell. A drain 224 of the column select transistor YSEL0 is connected to a landing pad 244 via a contact plug 234. The landing pad 244 is coupled to a global bit line 264 through a via plug 254. A source 206 of the discharge transistor DCH0 is connected to a landing plug 246 through a contact plug 216, an impurity region 226 of the epitaxial layer 220, and a contact plug 236, and the landing plug 246 is coupled to a ground voltage.

Figure 9:
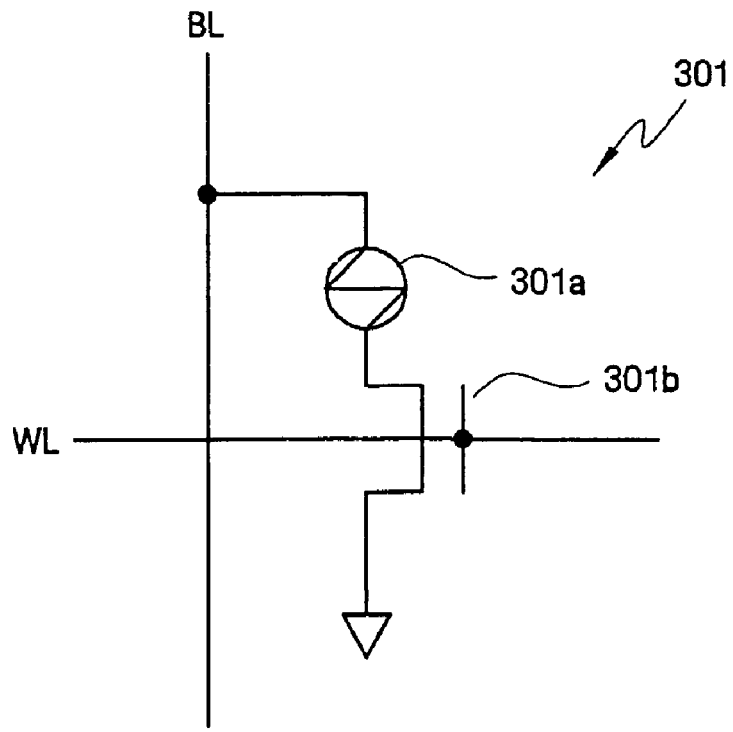
FIG. 9 is a circuit diagram of a phase-change memory cell in the phase-change random access memory device according to the fourth embodiment of the present invention.

FIG. 9 is a circuit diagram of a phase-change memory cell 301 in the phase-change random access memory device according to the fourth embodiment of the present invention. Components each having the same function for describing the embodiment shown in FIG. 2 are respectively identified by the same reference numerals, and their repetitive description will be omitted.

Referring to FIG. 9, the phase-change memory cell 301 uses a transistor that is disposed between a variable resistor 301a and a ground voltage, and has a gate connected to a word line WL as a control element 301b controlling current flowing through the variable resistor 301a. Unlike a case in which a diode is used as the control element 301b, the word line WL is driven to high level to turn on a transistor when the phase-change memory cell 301 is selected.

Figure 10:
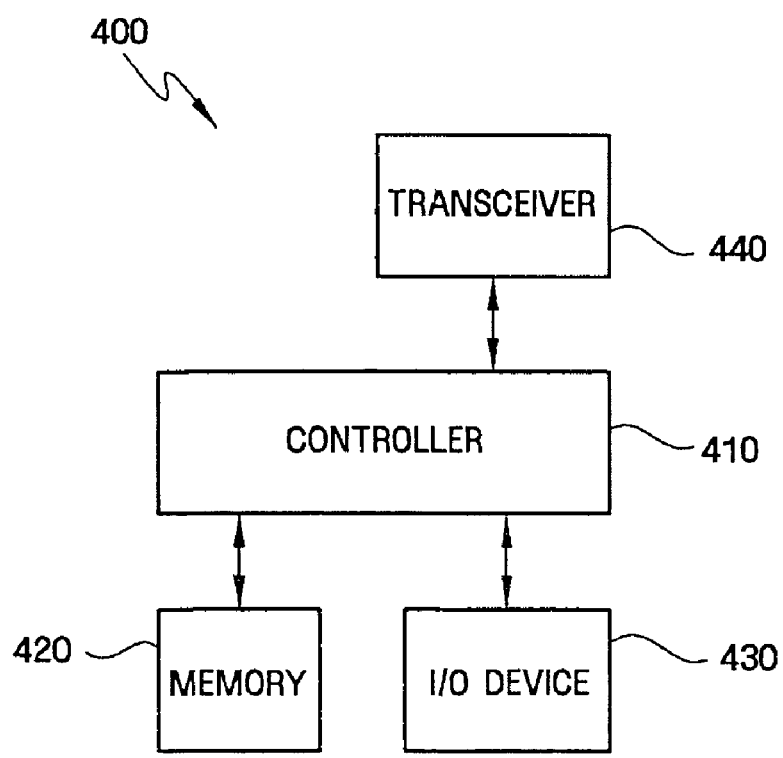
FIG. 10 is a schematic block diagram of a portable media system including phase-change random access memory devices according to the embodiments of the present invention.

FIG. 10 is a schematic block diagram of a portable media system including phase-change random access memory device according to embodiments of the present invention. In an embodiment of the present invention, a mobile phone as the portable media system is described by way of example, but the invention is not limited thereto. Rather, the invention may also be applied to a two-way communications system, a one-way pager, a two-way pager, a personal communications system, a portable computer, a personal data assistance (PDA), an MPEG audio layer-3 (MP3) player, a digital camera, and other electronic devices.

Referring to FIG. 10, the portable media system 400 includes a controller 410, a memory unit 420, an I/O device 430, and a transceiver 440.

The controller 410 may, for example, include microprocessors, digital signal processors, microcontrollers, and the like.

The memory 420 stores messages transmitted to the portable media system 400 or an external device. That is to say, the memory 420 stores data or instructions executed by the controller while the portable media system 400 is operating. The memory 420 is composed of one or more different kinds of memories. For example, the memory 420 may be a volatile memory device, or a nonvolatile memory device such as a flash memory device and/or a phase-change memory device. Here, usable examples of the phase-change memory device include PRAMs according to preferred embodiments of the present invention.

In particular, the most challenging task of the portable media system 400 is to minimize the amount of current consumed. As described in the foregoing embodiments of the present invention, the current and power consumption can be minimized by decreasing resistance of a column select transistor in a phase-change memory cell far away from a write and/or read circuit, thereby improving reliability during write and/or read operation.

The portable media system 400 may transmit or receive messages in a wireless manner through the transceiver 440 connected to an antenna (not shown). Here, the portable media system 400 may transmit or receive messages using protocols such as CDMA (Code Division Multiple Access), GSM (Global System for Mobile communication), NADC (North 20 American Digital Cellular), TDMA (Time Division Multiple Access), ETDMA (Extended TDMA), third-generation WCDMA (Wideband CDMA), CDMA-2000, etc.

The I/O device 430 generates a message by user's manipulation. The I/O device 430 may comprise a keypad, a monitor, and the like.

A phase-change random access memory device of the present invention provides at least one of the following advantages. First, the phase-change random access memory device of the present invention can prevent failures during write and/or read operations. Second, the phase-change random access memory device provides a phase-change memory cell in which a reset state can be written surely, and whereby the resistance margin of the phase-change memory cells increase by reducing a distribution of set resistance, which improves the reliability of phase-change memory cells. Third, the phase-change random access memory device can decrease the level of write current and/or read current, thereby reducing current consumption.

While the present invention has been particularly shown and described with reference to exemplary embodiments thereof, it will be understood by those of ordinary skill in the art that various changes in form and detail may be made therein without departing from the spirit and scope of the present invention as defined by the following claims. Therefore, it is to be understood that the above-described embodiments have been provided only in a descriptive sense, and should not be construed as placing any limitation on the scope of the invention.

What is claimed is:

1. A phase-change random access memory device comprising:
    a global bit line connected to a write circuit and a read circuit;
    a plurality of local bit lines connected to a plurality of phase-change memory cells; and
    a plurality of column select transistors, each column select transistor selectively connecting the global bit line with one of the plurality of local bit lines, the plurality of column select transistors comprising at least first and second column select transistors, the first column select transistor being located closer to the write circuit and the read circuit than the second column select transistor,
    wherein a resistance of the first column select transistor, when selectively connecting a corresponding local bit line and the global bit line, is greater than a resistance of the second column select transistor, when selectively connecting a corresponding local bit line and the global bit line, and
    wherein a concentration of impurities doped into a channel region of the second column select transistor is higher than a concentration of impurities doped into a channel region of the first column select transistor.

2. The phase-change random access memory device of claim 1, wherein the second column select transistor is larger than the first column select transistor.

3. The phase-change random access memory device of claim 1, wherein each of the phase-change memory cells includes a variable resistor containing a phase-change material having first and second resistances, and a control element that controls current flowing through the variable resistor.

4. The phase-change random access memory device of claim 3, wherein the phase change material contains germanium (Ge), antimony (Sb), and tellurium (Te).

5. The phase-change random access memory device of claim 3, wherein the control element is a diode connected in series to the variable resistor.

6. A phase-change random access memory device comprising:
    a global bit line connected to a write circuit and a read circuit;
    a plurality of local bit lines connected to a plurality of phase-change memory cells;
    a plurality of column select transistors, each column select transistor selectively connecting the global bit line with one of the plurality of local bit lines, the plurality of column select transistors comprising at least first and second column select transistors, the first column select transistor being located closer to the write circuit and the read circuit than the second column select transistor; and
    a first discharge transistor that discharges a voltage of a local bit line corresponding to the first column select transistor when the first column select transistor is off, and a second discharge transistor that discharges a voltage of a local bit line corresponding to the second column select transistor when the second column select transistor is off,
    wherein a resistance of the first column select transistor, when selectively connecting the corresponding local bit line and the global bit line, is greater than a resistance of the second column select transistor, when selectively connecting the corresponding local bit line and the global bit line.

7. The phase-change random access memory device of claim 6, wherein the first and second column select transistors are disposed in a different layer than the first and second discharge transistors.

8. A phase-change random access memory device comprising:
- a plurality of memory blocks, each having multiple phase-change memory cells;
- a global bit line connected to a write circuit and a read circuit, and extending in one direction to be shared by the plurality of memory blocks;
- a plurality of local bit lines, each of which extends in the one direction and is connected to a plurality of the phase-change memory cells; and
- a plurality of column select transistors, each column select transistor corresponding to a memory block of the plurality of memory blocks and selectively coupling the global bit line to a corresponding one of the plurality of local bit lines,
- wherein a resistance of a column select transistor, when coupling the global bit line to the corresponding one of the plurality of local bit lines, located far from the write circuit and the read circuit is less than a resistance of a column select transistor, when coupling the global bit line to the corresponding one of the plurality of local bit lines, located close to the write circuit and the read circuit, and
- wherein a concentration of impurities doped into a channel region of the column select transistor located far from the write and/or read circuit is higher than a concentration of impurities doped into a channel region of the column select transistor located close to the write circuit and the read circuit.

9. The phase-change random access memory device of claim 8, wherein the column select transistor located far from the write circuit and the read circuit is larger than the column select transistor located close to the write circuit and the read circuit.

10. The phase-change random access memory device of claim 8, further comprising a discharge transistor that discharges the voltage of the local bit line corresponding to the column select transistor when the column select transistor is off.

11. The phase-change random access memory device of claim 10, wherein the column select transistors are disposed in a different layer than the discharge transistor.

12. The phase-change random access memory device of claim 8, wherein the plurality of memory blocks are clustered into at least two groups.

13. A phase-change random access memory device comprising:
- a global bit line connected to an input/output circuit;
- a plurality of local bit lines, each connected to a plurality of phase-change memory cells; and
- a plurality of column select transistors selectively connecting the global bit line with one of the plurality of local bit lines, each column select transistor having a resistance that depends on a distance of the column select transistor from the input/output circuit,
- wherein a resistance of a column select transistor located far from the input/output circuit is less than a resistance of a column select transistor located close to the write circuit and the read circuit, a concentration of impurities doped into a channel region of the column select transistor located far from the input/output circuit being higher than a concentration of impurities doped into a channel region of the column select transistor located close to the input/output circuit.

14. The phase-change random access memory device of claim 13, wherein a resistance of a column select transistor located far from the write circuit and the read circuit is less than a resistance of a column select transistor located close to the write circuit and the read circuit.

15. The phase-change random access memory device of claim 13, further comprising a discharge transistor that discharges a voltage of the local bit line.

16. The phase-change random access memory device of claim 15, wherein the column select transistors are disposed in a different layer than the discharge transistor.

17. The phase-change random access memory device of claim 13, wherein each of the phase-change memory cells comprises a variable resistor containing a phase-change material having first and second resistances, and a control element that controls current flowing through the variable resistor.

18. A phase-change random access memory device comprising:
- a global bit line connected to an input/output circuit;
- a plurality of local bit lines connectable to the global bit line;
- a first memory block comprising at least one first phase-change memory cell connected to a first local bit line of the plurality of bit lines and selectively connected to the global bit line through a first column select transistor having a first resistance;
- a second memory block located further from the I/O circuit than the first memory block, the second memory block comprising at least one second phase-change memory cell connected to the first local bit line and selectively connected to the global bit line through a second column select transistor having a second resistance,
- wherein the second resistance is less than the first resistance, such that a total resistance of a first current path from the I/O circuit to the at least one first phase-change memory cell in the first memory block is substantially the same as a total resistance of a second current path from the I/O circuit to the at least one second phase-change memory cell in the second memory block.

19. The phase-change random access memory device of claim 18, wherein the second column select transistor larger than the first column select transistor.

20. The phase-change random access memory device of claim 18, wherein a concentration of impurities doped into a channel region of the second column select transistor is higher than a concentration of impurities doped into a channel region of the first column select transistor located close to the write circuit and the read circuit.

* * * * *